United States Patent
Tan et al.

(10) Patent No.: US 6,878,623 B2
(45) Date of Patent: Apr. 12, 2005

(54) TECHNIQUE TO ACHIEVE THICK SILICIDE FILM FOR ULTRA-SHALLOW JUNCTIONS

(75) Inventors: Cheng Cheh Tan, Singapore (SG); Randall Cher Liang Cha, Singapore (SG); Alex See, Singapore (SG); Lap Chan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/457,885

(22) Filed: Jun. 9, 2003

(65) Prior Publication Data

US 2003/0207565 A1 Nov. 6, 2003

Related U.S. Application Data

(63) Continuation-in-part of application No. 09/774,417, filed on Feb. 1, 2001, now abandoned.

(51) Int. Cl.[7] .............................................. H01L 21/44
(52) U.S. Cl. ...................... 438/655; 438/592; 438/595; 438/596; 438/652; 438/649; 438/664
(58) Field of Search ................................. 438/585, 592, 438/595, 596, 618, 622, 624, 652, 655, 642, 664, 648, 649; 257/754, 755, 757

(56) References Cited

U.S. PATENT DOCUMENTS

| | | | | |
|---|---|---|---|---|
| 4,638,347 A | * | 1/1987 | Iyer | 257/386 |
| 5,091,763 A | * | 2/1992 | Sanchez | 257/344 |
| 5,156,994 A | * | 10/1992 | Moslehi | 438/647 |
| 5,633,523 A | * | 5/1997 | Kato | 257/369 |
| 5,780,348 A | | 7/1998 | Lin et al. | 438/303 |
| 5,789,298 A | * | 8/1998 | Gardner et al. | 438/286 |
| 5,824,588 A | | 10/1998 | Liu | 438/302 |
| 5,882,973 A | | 3/1999 | Gardner et al. | 438/279 |
| 5,923,986 A | | 7/1999 | Shen | 438/303 |
| 6,015,740 A | * | 1/2000 | Milic-Strkalj | 438/300 |
| 6,020,242 A | | 2/2000 | Tsai et al. | 438/279 |
| 6,156,615 A | * | 12/2000 | Kepler | 438/305 |
| 6,221,767 B1 | * | 4/2001 | Hsu et al. | 438/658 |
| 6,383,906 B1 | * | 5/2002 | Wieczorek et al. | 438/592 |

* cited by examiner

*Primary Examiner*—Maria F. Guerrero
(74) *Attorney, Agent, or Firm*—George D. Saile; Rosemary L. S. Pike (57) ABSTRACT

A gate structure having associated (LDD) regions and source and drain is formed as is conventional. A first oxide spacer, for example, is formed along the sidewalls of the gate structure. A layer of metal such as titanium is then deposited over the surface of the gate structure. Second sidewall spacers are formed covering the metal over the first sidewall spacer and covering the metal over isolation regions. A layer of polysilicon is deposited over the surface of the gate structure. A rapid thermal annealing (RTA) is performed causing the metal to react with both the silicon in the junction below the metal and the polysilicon above the metal forming a metal silicide. Metal along the sidewalls between the first and second sidewall spacers and over the isolation regions does not react and is etched away. By providing an additional source of silicon in the polysilicon layer above the metal, a thicker silicide is achieved.

25 Claims, 6 Drawing Sheets

TECHNIQUE TO ACHIEVE THICK SILICIDE FILM FOR ULTRA-SHALLOW JUNCTIONS

This is a Continuation-in-Part application of CS-00-018, Ser. No. 09/774,417, filed on Feb. 1, 2001 now abandoned, assigned to a common assignee.

BACKGROUND OF THE INVENTION

(1) Field of the Invention

The invention generally relates to an interconnection process used in semiconductor manufacturing and, more particularly, to a method of forming thick silicide films over ultra-shallow junctions in the fabrication of integrated circuits.

(2) Description of Prior Art

Silicide interconnection is formed on integrated circuits by first sputtering a metal such as titanium (Ti) over the surface of a completed structure. These structures are typically composed of doped silicon or silicon oxides or metal nitrides. When heated the metals over the doped silicon react with the silicon to form conductive compounds known as silicides, ($TiSi_2$ for example). Because of this reaction, the doped silicon under the deposited metal is consumed at a rate approximately twice the thickness of the titanium layer. Metal over the silicon oxide or metal nitride areas remains unchanged and is easily removed using wet etching techniques. This leaves conductive lines and contacts in the silicide. In sub-quarter-micron MOSFET architectures, it is necessary to use ultra-shallow source and drain (S/D) regions. Ultra-shallow junctions limit the available silicon for consumption and therefore the thickness of silicide film must be reduced. Thinner silicides have the disadvantages of increased sheet resistance, film discontinuity, contact gouging at non-silicided locations, and high contact and parasitic resistances. For thin silicide films, C54 phase $TiSi_2$ is preferred due to its high electrical conductivity. Triple-grain boundaries have a much higher energy state and promote C54 grain formation. Pre-amorphization implants (PAI) are often used to enhance C54 grain formation. This, however, results in undesirable effects such as implantation induced damage (e.g. transient enhanced diffusion in boron and junction leakage), film discontinuity and non-uniformity. For thick silicide films, C54 phase $TiSi_2$ need not nucleate at triple-grain boundaries of C49 phase $TiSi_2$ grains (hydrogen can nucleate at the grain boundaries), so the PAI is not required.

Other approaches for improving the silicide processing exist. U.S. Pat. No. 5,824,588 to Liu teaches a method that uses two gate sidewall spacers. The first spacer is higher than the second and acts as barrier to eliminate shorts between the source/drain and gate. U.S. Pat. No. 6,020,242 to Tsai et al. teaches a method where selected devices and circuit areas are blocked from the silicide process. U.S. Pat. No. 5,923,986 to Shen teaches a method incorporating an umbrella-like second spacer that prevents metal from being sputtered under the spacer, thereby eliminating shorts. U.S. Pat. No. 5,780,348 to Lin et al. teaches a method of forming parasitic spacers to reduce electrostatic discharge (ESD) problems. U.S. Pat. No. 5,882,973 to Gardner et al. teaches a method of forming variable width sidewall spacers,

SUMMARY OF THE INVENTION

A principal object of the present invention is to provide a method that allows the formation of thicker silicide interconnections while consuming less of the underlying silicon.

Another object of the present invention is to provide a method that allows the formation of thicker silicide interconnections over shallow junctions without compromising the functionality of the shallow junctions.

Another object of the present invention is to provide a method that is self-aligning that facilitates the formation of thicker silicide interconnections over shallow junctions without compromising the functionality of the shallow junctions.

Another object of the present invention is to provide a method that is self-aligning that facilitates the formation of thicker silicide interconnections over shallow junctions without compromising the functionality of the shallow junctions and minimizes the leakage between the S/D and gate.

These objects are achieved using a process where the gate structure, comprising a gate dielectric covered by a gate electrode, is formed by conventional techniques upon a substrate. A low-energy implantation is performed to form ultra-shallow LDD regions in the substrate not protected by the gate structure. A first spacer composed of tetraethyloxysilane (TEOS) oxide, for example, is formed along the sidewalls of the gate structure by conventional methods. This may be followed by a second implantation forming the source and drain (S/D). A layer of metal such as titanium (Ti), for example, is then deposited over the surface of the gate structure. A second sidewall spacer composed of titanium nitride (TiN), for example, is formed along the sidewalls of the gate structure covering the metal over the first sidewall spacer. At the same time, a spacer layer is formed covering the metal over isolation regions. A layer of polysilicon is then deposited over the surface of the gate structure. A rapid thermal annealing (RTA) is performed which causes the metal to react with both the silicon in the junction below the metal and the polysilicon above the metal forming a metal silicide ($TiSi_2$ when using titanium metal). Metal along the sidewalls between the first and second sidewall spacers and over the isolation regions does not react and remains unchanged. The polysilicon that has not reacted with the metal is then etched away. This is followed by removal of the second spacer and the unreacted metal leaving conductive lines and device contacts. By providing an additional source of silicon in the polysilicon layer above the metal, a thicker silicide is achieved.

BRIEF DESCRIPTION OF THE DRAWINGS

In the accompanying drawings forming a material part of this description, there is shown.

DESCRIPTION OF THE PREFERRED EMBODIMENTS

The preferred embodiment describes formation of thicker silicide on the contacts of a MOS transistor. It will be understood by those skilled in the art that the invention can be extended to the formation of thicker silicide on any structure on a semiconductor wafer.

Figure 1:
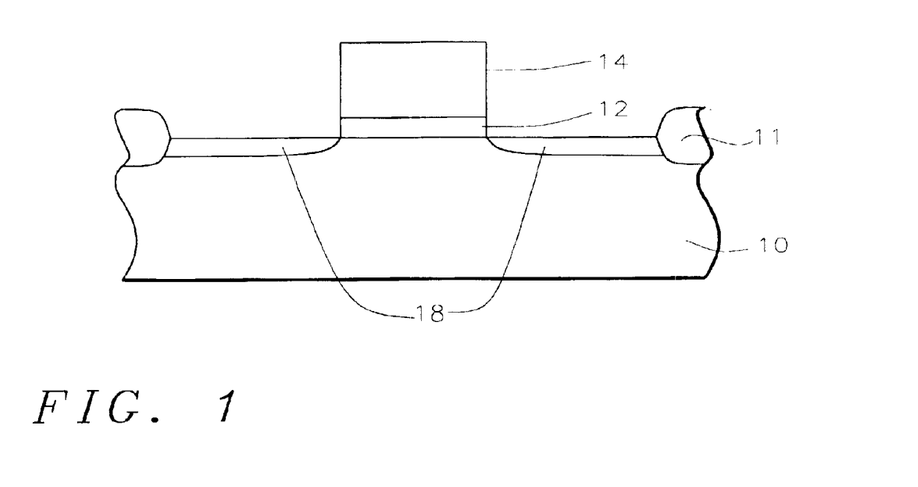
FIG. 1 through FIG. 11 schematically illustrating in cross-sectional representation a preferred embodiment of the present invention.

Referring now more particularly to FIG. 1, a partially formed gate structure is represented. A substrate 10 is provided. Isolation features such as field oxide regions 11 are formed in the substrate to separate active areas from one another. The substrate 10 may contain n or p type wells, devices, junctions, and other features (not shown) formed prior to deposition and patterning of the gate dielectric 12 and conductive gate 14. The gate dielectric 12 may comprise one or more of a list containing silicon oxide, tantalum pentoxide, titanium oxide, silicon nitride, or nitrided oxides and so on. The conductive gate 14 may comprise one or more of a list containing silicon, polysilicon, tungsten or tungsten silicide (WSi$_x$) and so on. A low energy implantation (not shown) forms the lightly doped source and drain (LDD) regions 18 in the substrate 10 not protected by the gate structure 12/14. Typical depths of the LDD regions 18 are between about 300 to 1000 Angstroms. This implantation is self-aligned using the gate structure 12/14 as a mask.

Figure 2:
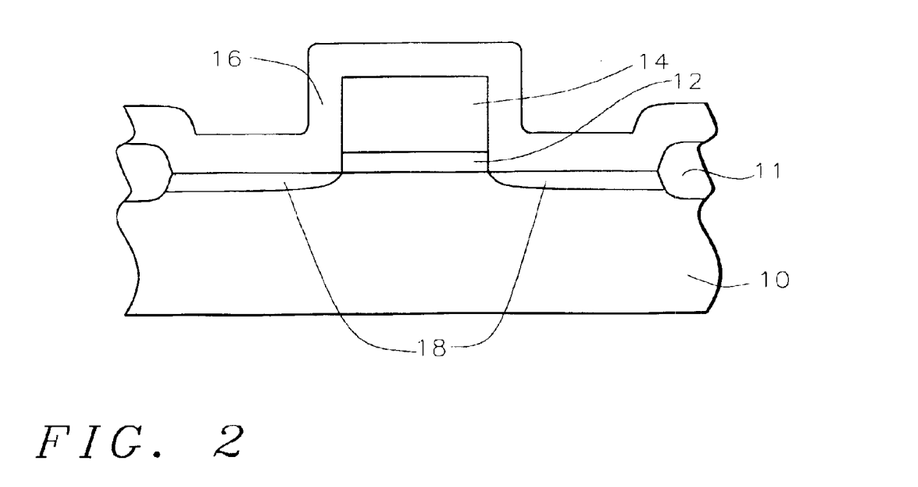
Figure 3:
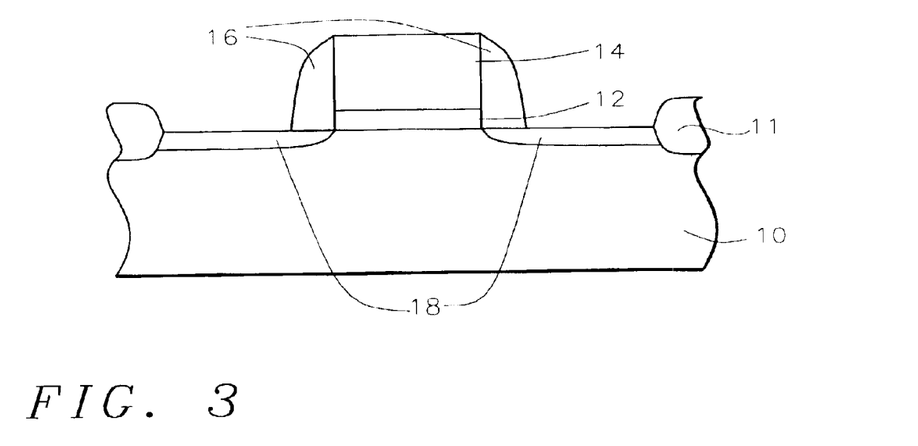

Referring now to FIG. 2 and FIG. 3, one method for forming a sidewall spacer along the gate structure 12/14 is described. Referring more particularly to FIG. 2, a layer of spacer material 16 is conformally deposited overlying the surface of the device to a thickness of between about 800 to 1500 Angstroms. The spacer material 16 is composed of one or more of a list containing silicon oxide, TEOS oxide, nitrides or oxynitrides deposited by low-pressure chemical vapor deposition (LPCVD), plasma enhanced CVD (PECVD), atmospheric pressure CVD (APCVD), sub-atmospheric pressure CVD (SACVD), or high density plasma CVD (HDPCVD), for example. The spacer material 16 is anisotropically etched by dry etching using $CHF_3/C_4F_8/O_2$ chemistry, for example, leaving sidewall spacers 16 as shown in FIG. 3. Endpoint is reached when the underlying structures including substrate 10, gate structure 12/14 and LDD region 18 are exposed to etchants.

Figure 4:
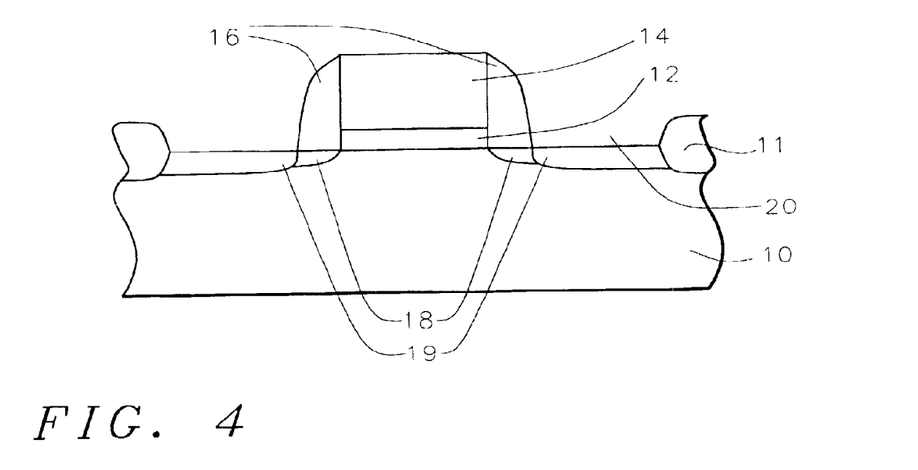

Referring now to FIG. 4, a low energy implantation (not shown) forms the source and drain (S/D) region 19. The implantation is again self-aligned using the gate structure 12/14 and sidewall spacers 16 as a mask. The depths of the S/D region 19 are between about 500 to 1500 Angstroms.

Figure 5:
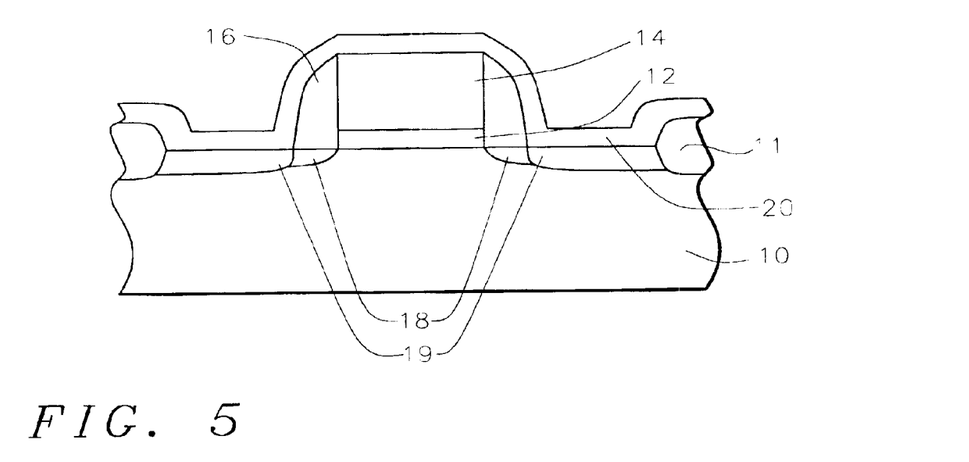

Referring now to FIG. 5, a metal layer 20 comprised of one or more from a list containing titanium, platinum, nickel and cobalt is deposited overlying the surface of the device by sputtering to a thickness of between about 100 to 500 Angstroms.

Figure 6:
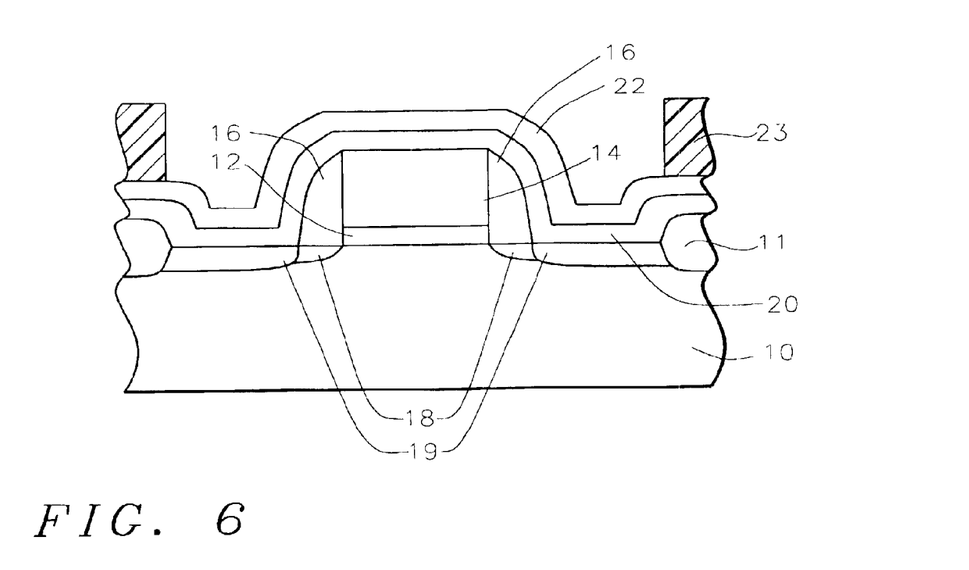
Figure 7:
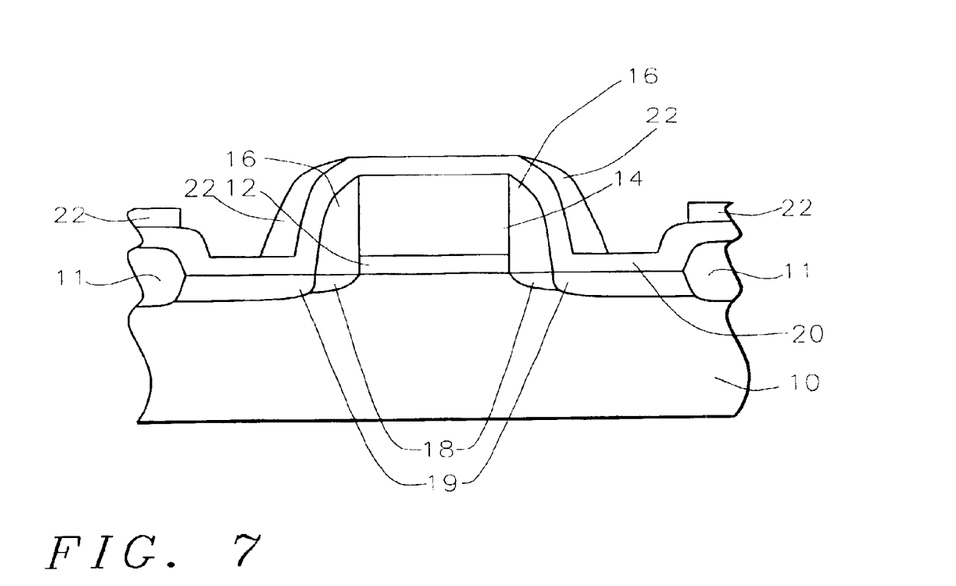

Referring now to FIG. 6 and FIG. 7, the formation of the second sidewall spacers is shown. As shown in FIG. 6, second spacer layer 22 composed of one or more of a list containing titanium nitride (TiN), silicon nitride ($Si_3N_4$), silicon dioxide ($SiO_2$), TEOS oxide, nitrides or oxynitrides is deposited over the surface of the device by APCVD, LPCVD or PECVD to a thickness of between about 200 to 1000 Angstroms. A mask 23 is formed over the isolation regions. The second spacer layer 22 is then etched to expose the metal layer 20 over the gate structure 12/14. This forms a second set of sidewall spacers 22 formed by the second spacer layer 22 along the sidewalls of the gate structure 12/14 overlying the metal layer 20 and also leaves a portion of the spacer layer 22 overlying the metal layer 20 over the isolation regions 11 as shown in FIG. 7. Only one etching step is required to protect both the sidewalls of the gate and the isolation regions.

Figure 8:
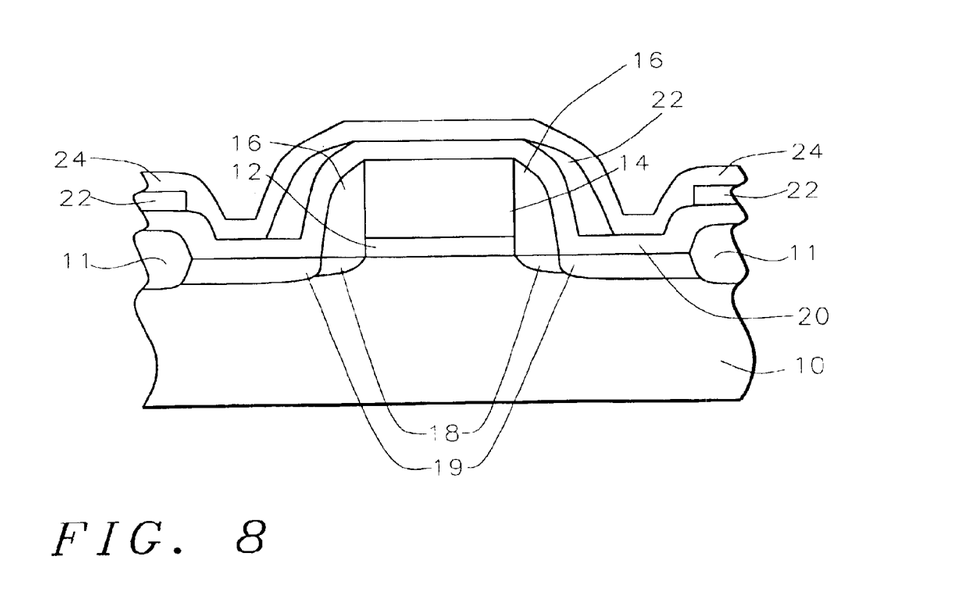
Figure 9:
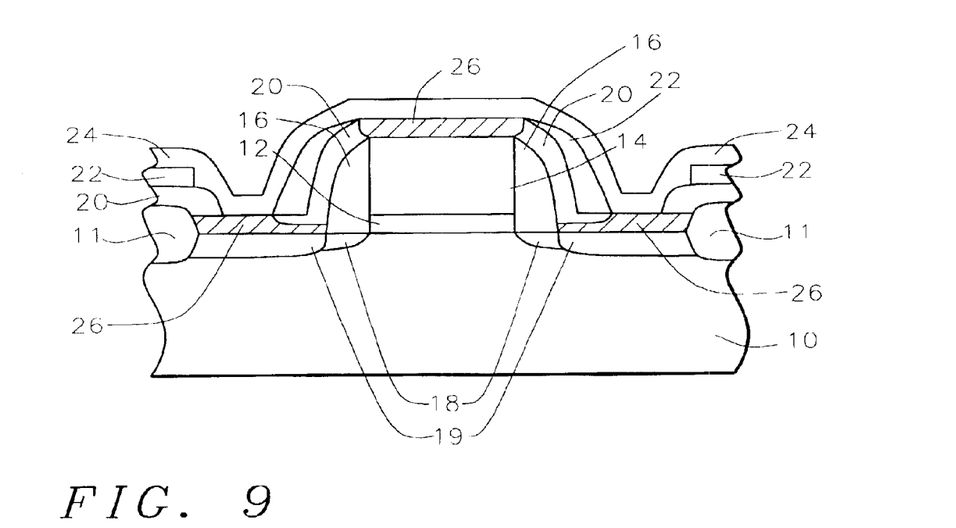

Referring now to FIG. 8, a polysilicon layer 24 is deposited by low-pressure chemical vapor deposition (LPCVD), plasma enhanced chemical vapor deposition (PECVD) or other CVD techniques overlying the surface of the device to a thickness of between about 300 to 900 Angstroms. This is followed by a rapid thermal annealing (RTA) between 400 and 900° C. (depending upon the metal used) while being purged in an inert gas such as nitrogen, for example, at a rate of between about 3 and 10 sccm for between 15 to 60 seconds. Wherever the metal layer 20 contacts silicon in the conductive gate 14, the S/D regions 18 and the polysilicon layer 24, a reaction occurs and a silicide region 26 is formed as shown in FIG. 9. Alternately, laser or furnace annealing may be used to facilitate salicidation; however, furnace annealing is not recommended. The silicide reduces the contact resistance to the silicon. During the silicidation, some of the silicon is consumed, thereby thinning the conductive gate 14, the LDD region 18, the S/D region 19 and the polysilicon layer 24. The resulting silicide region 26 has a thickness of between about 300 to 700 Angstroms. The presence of the second spacers 22 between the metal layer 20 and the polysilicon layer 24 prevents salicidation of the polysilicon layer 24 in contact with the second spacers 22. The spacer layer 22 between the metal layer 20 and the polysilicon layer 24 over the isolation regions 11 prevents salicidation of the polysilicon layer over the isolation regions.

Figure 10:
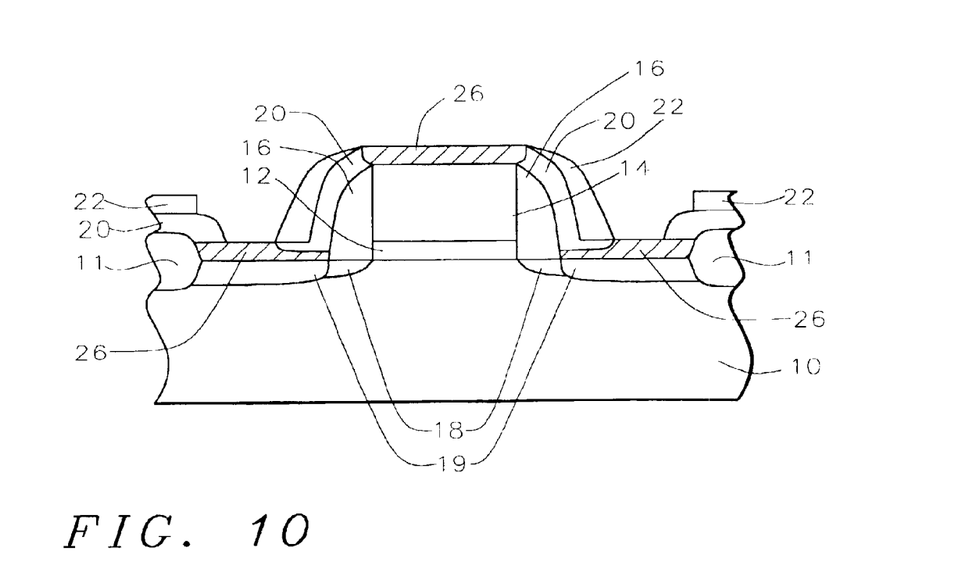

Referring now to FIG. 10, an etch step is performed to remove the unreacted polysilicon layer 24. This etch is performed using a timed wet etch with potassium hydroxide (KOH) or using an isotropic plasma etching with a chemistry of $Cl_2/SF_6/O_2$.

Figure 11:
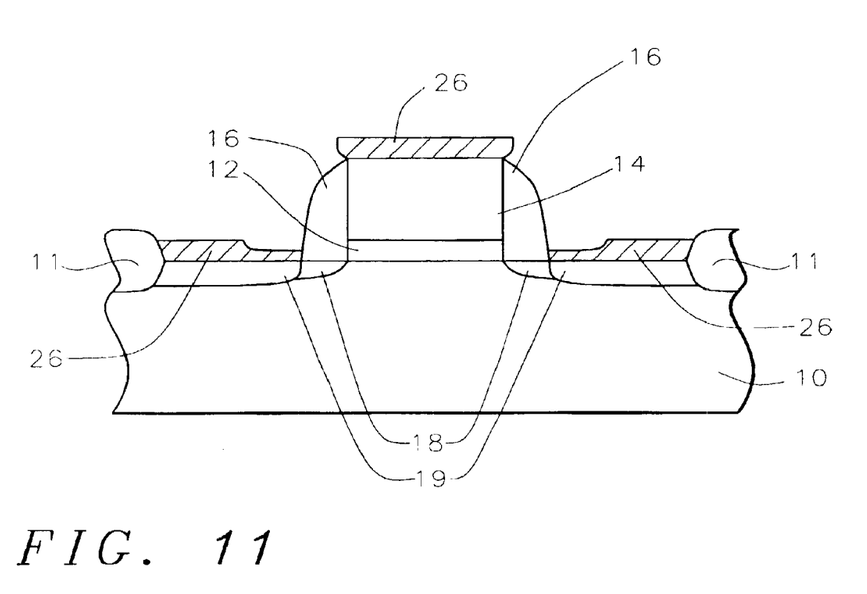

Referring now to FIG. 11, a wet etch with a chemistry of ammonium hydroxide ($NH_4OH$), hydrogen peroxide ($H_2O_2$), and water ($H_2O$), for example, is used to remove the remaining second spacer layer 22 and unreacted metal layer 20.

The present invention describes a method where a gate structure is formed upon a substrate. An implantation is performed to form lightly doped source and drain (LDD) regions in the substrate not protected by the gate structure. A first spacer is formed along the sidewalls of the gate structure. A second implantation is performed to form source and drain (S/D) regions in the substrate not protected by the gate and first spacer. A layer of metal is then deposited over the surface of the gate structure. A second sidewall spacer is then formed along the sidewalls of the gate structure covering the metal over the first sidewall spacer and a second spacer layer is formed covering the metal over the isolation regions. A layer of polysilicon is then deposited over the surface. A rapid thermal annealing (RTA), for example, is performed causing the metal to react with both the silicon in the S/D junction below the metal and the polysilicon above the metal forming a metal silicide. Metal between the two sidewall spacers and over the isolation regions does not react. The unreacted polysilicon is then etched away, followed by removal of the second spacer and the unreacted metal.

The present invention has all of the advantages of a silicide process. It is self-aligning and reduces the contact resistance to the device electrode. In addition, because of the additional silicon source provided by the overlying polysilicon layer, thicker silicide layers are produced without consuming all of the silicon in the junction below the silicide. Without this step, a thinner silicide would be necessary which could result in incomplete coverage and higher contact resistance.

While the invention has been particularly shown and described with reference to the preferred embodiments thereof, it will be understood by those skilled in the art that various changes in form and details may be made without departing from the spirit and scope of the invention.

What is claimed is:

1. A method of fabricating integrated circuit metal silicide comprising:

providing a semiconductor substrate having isolation regions formed therein;

providing a gate structure comprised of a gate dielectric and a polysilicon gate conductor on said semiconductor substrate;

implanting ions into said semiconductor substrate not covered by said gate structure, thereby forming lightly doped source and drain regions;

forming first spacers along the sidewalls of said gate structure;

implanting ions into said semiconductor substrate not covered by said gate structure and said first spacers, thereby forming source and drain regions;

depositing a metal layer overlying said gate structure, said first spacers, said source and drain regions, and said isolation regions;

simultaneously forming second spacers in a single step, etching both overlying said metal layer along said sidewalls of said gate structure and overlying said metal layer over said isolation regions;

depositing a polysilicon layer overlying said second spacers and said metal layer not covered by said second spacers;

thereafter thermally annealing said semiconductor substrate causing said metal layer in contact with said polysilicon layer and said source and drain region to transform into a metal silicide;

etching away said polysilicon layer that was not transformed to a metal silicide during said thermal annealing; and etching away said second spacers and said metal layer that was not transformed to a metal silicide during said thermal annealing thereby completing fabrication of said integrated circuit metal silicide.

2. The method according to claim 1 wherein said first spacers are composed of one of a group containing: silicon dioxide, tetraethyl-oxysilane (TEOS) oxide, nitrides and oxynitrides formed by one of a group containing: thermal oxidation, low-pressure chemical vapor deposition (LPCVD), and plasma-enhanced chemical vapor deposition (PECVD).

3. The method according to claim 1 wherein said second spacers are comprised of one of a group containing: titanium nitride, platinum nitride, cobalt nitride, silicon nitride, silicon dioxide, TEOS oxide, nitrides and oxynitrides deposited by LPCVD or PECVD.

4. The method according to claim 1 wherein said metal layer is composed of one of a group containing: titanium, platinum, nickel and cobalt deposited to a thickness of between about 100 to 500 Angstroms.

5. The method according to claim 1 wherein said polysilicon layer is deposited by CVD techniques including LPCVD and PECVD to a thickness of between about 300 to 900 Angstroms.

6. The method according to claim 1 wherein said thermal annealing is performed by rapid thermal annealing (RTA) at a temperature of between about 400 and 900° C. in a inert gas such as nitrogen with a flow rate of between about 3 to 10 sccm for between about 15 to 60 seconds.

7. The method according to claim 1 wherein said etching of said polysilicon layer is performed by timed wet-etch using potassium hydroxide (KOH).

8. The method according to claim 1 wherein said etching of said polysilicon layer is performed by isotropic plasma etching using a chemistry of $Cl_2/SF_6/O_2$.

9. The method according to claim 1 wherein said etching away of said second spacer and said metal layer is performed using a wet etch with a chemistry of ammonium hydroxide ($NH_4OH$), hydrogen peroxide ($H_2O_2$), and water ($H_2O$).

10. A method of fabricating integrated circuit metal silicide comprising:

providing a semiconductor substrate having isolation regions formed therein;

providing a gate structure comprised of a gate dielectric and a polysilicon gate conductor on said semiconductor substrate;

implanting ions into said semiconductor substrate not covered by said gate structure, thereby forming lightly doped source and drain regions;

forming first spacers along the sidewalls of said gate structure;

implanting ions into said semiconductor substrate not covered by said gate structure and said first spacers, thereby forming source and drain regions;

depositing a metal layer overlying said gate structure, said first spacers, said source and drain regions, and said isolation regions;

simultaneously forming second spacers in a single step etching comprised of one of a group containing: titanium nitride, platinum nitride, cobalt nitride, silicon nitride, silicon dioxide, TEOS oxide, nitrides and oxynitrides deposited by LPCVD or PECVD both overlying said metal layer along said sidewalls of said gate structure and overlying said metal layer over said isolation regions;

depositing a polysilicon layer overlying said second spacers and said metal layer not covered by said second spacers;

thereafter thermally annealing said semiconductor substrate causing said metal layer in contact with said polysilicon layer and said source and drain region to transform into a metal silicide;

etching away said polysilicon layer that was not transformed to a metal silicide during said thermal annealing; and etching away said second spacers and said metal layer that was not transformed to a metal silicide during said thermal annealing thereby completing fabrication of said integrated circuit metal silicide.

11. The method according to claim 10 wherein said first spacers are composed of one of a group containing: silicon dioxide, tetraethyl-oxysilane (TEOS) oxide, nitrides and oxynitrides formed by one of a group containing: thermal oxidation, low-pressure chemical vapor deposition (LPCVD), and plasma-enhanced chemical vapor deposition (PECVD).

12. The method according to claim 10 wherein said metal layer is composed of one of a group containing: titanium, platinum, nickel and cobalt deposited to a thickness of between about 100 to 500 Angstroms.

13. The method according to claim 10 wherein said polysilicon layer is deposited by CVD techniques including LPCVD and PECVD to a thickness of between about 300 to 900 Angstroms.

14. The method according to claim 10 wherein said thermal annealing is performed by rapid thermal annealing (RTA) at a temperature of between about 400 and 900° C. in a inert gas such as nitrogen with a flow rate of between about 3 to 10 sccm for between about 15 to 60 seconds.

15. The method according to claim 10 wherein said etching of said polysilicon layer is performed by timed wet-etch using potassium hydroxide (KOH).

16. The method according to claim 10 wherein said etching of said polysilicon layer is performed by isotropic plasma etching using a chemistry of $Cl_2/SF_6/O_2$.

17. The method according to claim 10 wherein said etching away of said second spacer and said metal layer is performed using a wet etch with a chemistry of ammonium hydroxide (NH$_4$OH), hydrogen peroxide (H$_2$O$_2$), and water (H$_2$O).

18. A method of fabricating integrated circuit metal silicide comprising:

providing a semiconductor substrate having isolation regions formed therein;

providing a gate structure comprised of a gate dielectric and a polysilicon gate conductor on said semiconductor substrate;

implanting ions into said semiconductor substrate not covered by said gate structure, thereby forming lightly doped source and drain regions;

forming first spacers along the sidewalls of said gate structure;

implanting ions into said semiconductor substrate not covered by said gate structure and said first spacers, thereby forming source and drain regions;

depositing a metal layer overlying said gate structure, said first spacers, said source and drain regions, and said isolation regions;

depositing a spacer layer overlying said metal layer comprised of one of a group containing: titanium nitride, platinum nitride, cobalt nitride, silicon nitride, silicon dioxide, TEOS oxide, nitrides and oxynitrides by LPCVD or PECVD;

simultaneously etching said spacer layer in a single step etching to form second spacers both overlying said metal layer along said sidewalls of said gate structure and overlying said metal layer over said isolation regions;

depositing a polysilicon layer overlying said second spacers and said metal layer not covered by said second spacers;

thereafter thermally annealing said semiconductor substrate causing said metal layer in contact with said polysilicon layer and said source and drain region to transform into a metal silicide wherein the presence of said second spacers prevents said polysilicon overlying said second spacers from reacting with said metal layer covered by said second spacer and wherein the presence of said polysilicon layer over said metal layer provides a silicon source for said metal silicide thereby reducing silicon consumption from said polysilicon gate conductor and said source and drain regions;

etching away said polysilicon layer that was not transformed to a metal silicide during said thermal annealing; and etching away said second spacers and said metal layer that was not transformed to a metal silicide during said thermal annealing thereby completing fabrication of said integrated circuit metal silicide.

19. The method according to claim 18 wherein said first spacers are composed of one of a group containing: silicon dioxide, tetraethyl-oxysilane (TEOS) oxide, nitrides and oxynitrides formed by one of a group containing: thermal oxidation, low-pressure chemical vapor deposition (LPCVD), and plasma-enhanced chemical vapor deposition (PECVD).

20. The method according to claim 18 wherein said metal layer is composed of one of a group containing: titanium, platinum, nickel and cobalt deposited to a thickness of between about 100 to 500 Angstroms.

21. The method according to claim 18 wherein said polysilicon layer is deposited by CVD techniques including LPCVD and PECVD to a thickness of between about 300 to 900 Angstroms.

22. The method according to claim 18 wherein said thermal annealing is performed by rapid thermal annealing (RTA) at a temperature of between about 400 and 900° C. in a inert gas such as nitrogen with a flow rate of between about 3 to 10 sccm for between about 15 to 60 seconds.

23. The method according to claim 18 wherein said etching of said polysilicon layer is performed by timed wet-etch using potassium hydroxide (KOH).

24. The method according to claim 18 wherein said etching of said polysilicon layer is performed by isotropic plasma etching using a chemistry of Cl$_2$/SF$_6$/O$_2$.

25. The method according to claim 18 wherein said etching away of said second spacer and said metal layer is performed using a wet etch with a chemistry of ammonium hydroxide (NH$_4$OH), hydrogen peroxide(H$_2$O$_2$), and water (H$_2$O).

* * * * *